(12) United States Patent
Wang

(10) Patent No.: US 7,084,653 B2
(45) Date of Patent: Aug. 1, 2006

(54) CONTACT-TYPE FILM PROBE

(75) Inventor: Chih-Yuan Wang, Taichung (TW)

(73) Assignee: Wintek Corporation, Taichung (TW)

( * ) Notice: Subject to any disclaimer, the term of this patent is extended or adjusted under 35 U.S.C. 154(b) by 0 days.

(21) Appl. No.: 11/014,971

(22) Filed: Dec. 20, 2004

(65) Prior Publication Data

US 2006/0132151 A1      Jun. 22, 2006

(51) Int. Cl.
*G01R 31/02* (2006.01)

(52) U.S. Cl. ..................... 324/754

(58) Field of Classification Search ............ 324/754, 324/761, 762, 158.1, 765, 770

See application file for complete search history.

(56) References Cited

U.S. PATENT DOCUMENTS 6,420,884 B1 *   7/2002   Khoury et al. ............. 324/754

\* cited by examiner

*Primary Examiner*—Jermele Hollington
*Assistant Examiner*—Tung X. Nguyen
(74) *Attorney, Agent, or Firm*—Rosenberg, Klein & Lee

(57) ABSTRACT

A contact-type film probe including a plastic substrate. Multiple signal transmission lines are arranged on one face of the substrate. Each signal transmission line penetrates through a section of the substrate near one end thereof. Each signal transmission line is coated with an insulating layer. A conductive layer is disposed on the other face of the substrate corresponding to each signal transmission line. The conductive layer is electrically connected with the signal transmission line. A contact conductive layer is further overlaid on each conductive layer. The contact conductive layers serve to directly electrically contact with the wires of the liquid crystal display to be tested.

6 Claims, 3 Drawing Sheets

CONTACT-TYPE FILM PROBE

BACKGROUND OF THE INVENTION

The present invention is related to a film probe for testing liquid crystal display, and more particularly to a contact-type film probe. Signal transmission lines and contact conductive layers are respectively disposed on two faces of the substrate for prolonging using life of the contact-type film probe.

In a conventional contact-type soft film probe structure, multiple one-to-one straight film probes are directly made on a specific tool according to the wire layout of a liquid crystal display. The probes directly contact with the wires of the liquid crystal display. After contacted, the signal will be input via the probes to activate the liquid crystal display. According to the state of display, it can be judged whether the quality of the liquid crystal display is good or bad.

FIGS. 3 and 4 show a conventional contact-type soft film probe. Multiple signal lines 82 are arranged on one face of a plastic substrate 81 according to wire layout of a liquid crystal display. A contact conductive layer 83 is disposed at one end of each signal line 82 to form a probe. The other section of the signal line 82 free from the contact conductive layer 83 is coated with an insulating layer 84.

The thickness of each layer of the film probe is in the grade of micron so that the thickness of the film probe as a whole is still very thin. Accordingly, when contacting the film probe with the wire 91 of the liquid crystal display 9 as shown in FIG. 5, it is necessary to slightly apply a pressure onto the probe, whereby the contact conductive layers 83 of the film probe can truly contact with the wires 91 of the liquid crystal display. However, during contacting, the contact conductive layers 83 will frictionally contact with the wires 91 of the liquid crystal display. Especially, the edges and corners of the wires 91 of the liquid crystal display tend to partially over-wear the contact conductive layers 83 and signal lines 82. This may cut off the contact conductive layers 83 and the signal lines 82. As a result, the signal cannot be normally transmitted to the wires of the liquid crystal display. This will make the liquid crystal display unable to display pictures or lead to poor display of the pictures. Accordingly, the test result of the liquid crystal display will be affected. Furthermore, in the case that the contact conductive layers 83 are worn out or cut off, the using life of the film probe will be shortened and the cost will be increased.

SUMMARY OF THE INVENTION

It is therefore a primary object of the present invention to provide a contact-type film probe including a plastic substrate. Multiple signal transmission lines are arranged on one face of the substrate. Multiple conductive layers are disposed on the other face of the substrate and respectively electrically connected with the signal transmission lines. A contact conductive layer is further overlaid on each conductive layer. The contact conductive layers serve to directly electrically contact with the wires of the liquid crystal display to be tested. Therefore, the using life of the film probe can be prolonged.

According to the above object, the contact-type film probe of the present invention includes a plastic substrate. Multiple signal transmission lines are arranged on one face of the substrate. Each signal transmission line penetrates through a section of the substrate near one end thereof. Each signal transmission line is coated with an insulating layer. A conductive layer is disposed on the other face of the substrate corresponding to each signal transmission line. The conductive layer is electrically connected with the signal transmission line. A contact conductive layer is further overlaid on each conductive layer. The contact conductive layers serve to directly electrically contact with the wires of the liquid crystal display to be tested.

The present invention can be best understood through the following description and accompanying drawings wherein:

DETAILED DESCRIPTION OF THE PREFERRED EMBODIMENT

Figure 1:
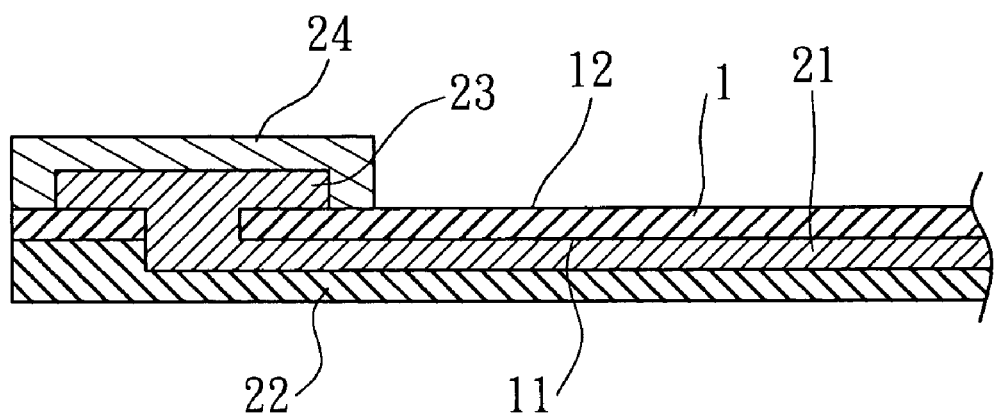
FIG. 1 is a sectional view showing the structure of the present invention.
Figure 2:
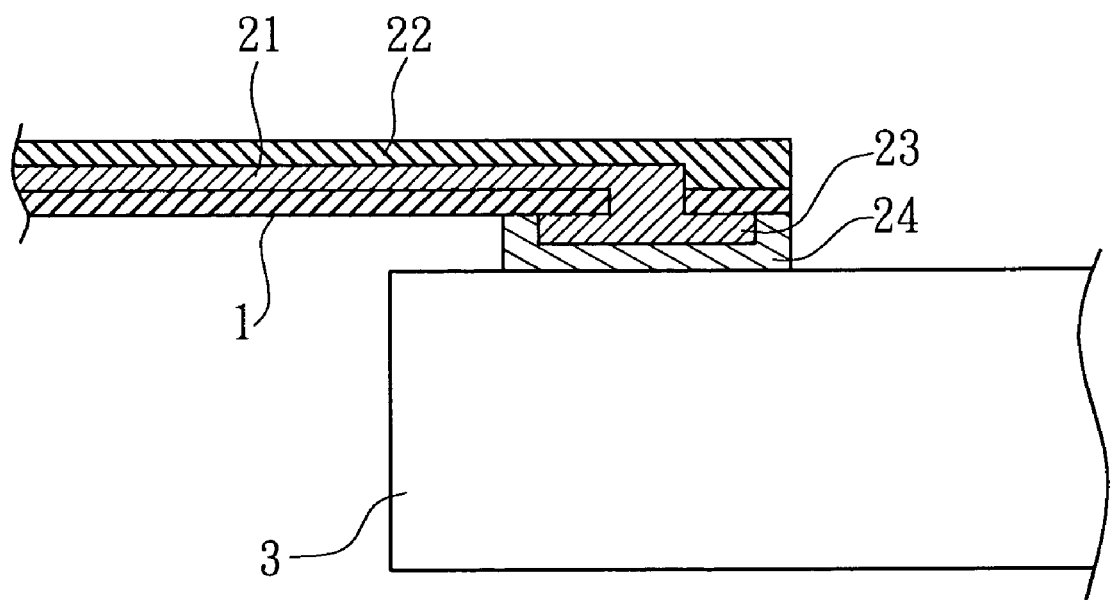
FIG. 2 is a sectional view showing the use of the present invention.
Figure 3:
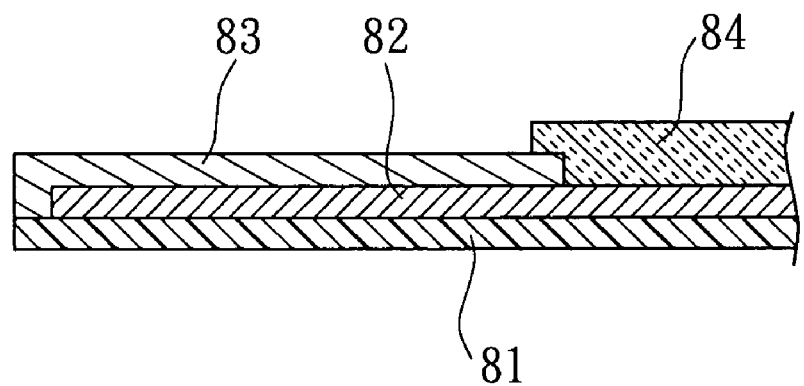
FIG. 3 is a sectional view showing the structure of a conventional contact-type soft film probe.
Figure 4:
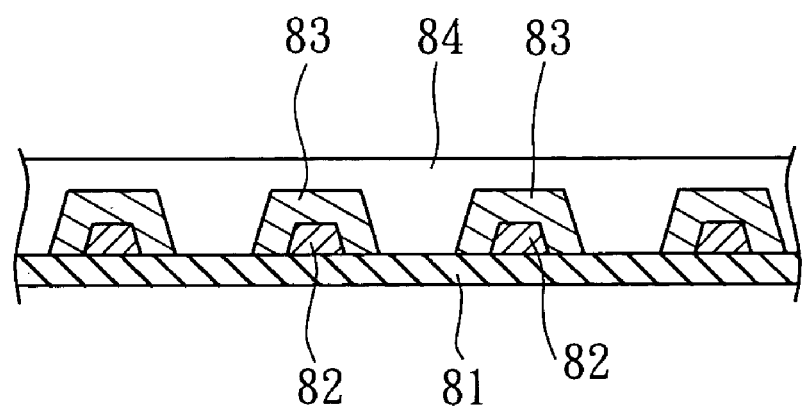
FIG. 4 is a sectional view in another direction, showing the structure of the conventional contact-type soft film probe.
Figure 5:
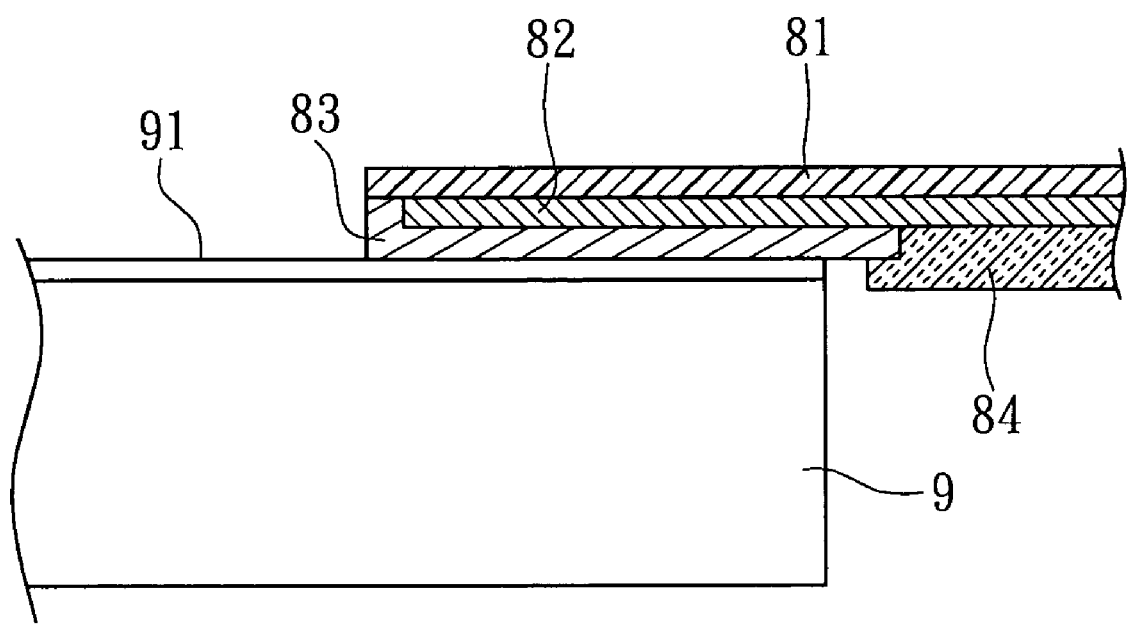
FIG. 5 is a sectional view showing the use of the conventional contact-type soft film probe.

Please refer to FIGS. 1 and 2. The contact-type film probe of the present invention includes a plastic substrate 1. Multiple signal transmission lines 21 are arranged on one face 11 of the substrate 1. Each signal transmission line 21 penetrates through a section of the substrate 1 near one end thereof. Each signal transmission line 21 is coated with an insulating layer 22. A conductive layer 23 is disposed on the other face 12 of the substrate 1 corresponding to each signal transmission line 21. The conductive layer 23 is electrically connected with the signal transmission line 21. A contact conductive layer 24 is further overlaid on each conductive layer 23.

The substrate 1 can be made of any of polyimide, PET, PC, PMMA and polysulfone. The conductive layer 23 can be made of any of gold, silver, copper, nickel, chromium and aluminum with a thickness within 0.1 µm~several hundred µm. The contact conductive layer 24 can be made of any of gold, silver, copper, nickel, chromium and aluminum with a thickness within 0.1 µm~several hundred µm.

In the above contact-type film probe structure of the present invention, the contact conductive layer 24 is disposed on the face of the substrate 1 free from the signal transmission line 21 and overlaid on the conductive layer 23. Therefore, the contact conductive layer 24 apparently protrudes from the substrate 1. Accordingly, when performing a test to the liquid crystal display, the contact conductive layer 24 will not contact with the edge or corner of the wires of the liquid crystal display 3 as shown in FIG. 2. In comparison with the prior art, the contact conductive layer 24 of the present invention face-to-face contacts with the wire of the liquid crystal display 3 so that the contact area is increased and the wear can be effectively reduced. Moreover, the signal transmission lines 21 are arranged on the other face of the substrate 1. Accordingly, even though the contact conductive layers 24 and the conductive layers 23 are considerably worn, it can be still ensured that the signal transmission lines 21 will not be cut off. Therefore, the using life of the film probe can be prolonged.

The above embodiment is only used to illustrate the present invention, not intended to limit the scope thereof.

Many modifications of the above embodiment can be made without departing from the spirit of the present invention.

What is claimed is:

1. A contact-type film probe comprising:
   a plastic substrate having first and second opposing faces;
   multiple signal transmission lines being arranged on the second face of the substrate, each signal transmission line penetrating through a section of the substrate near one end thereof;
   an insulating layer disposed on each signal transmission line;
   a plurality of conductive layers being disposed on the first face of the substrate in respective correspondence with the penetration of the signal transmission lines through the substrate, each conductive layer being electrically connected with the corresponding signal transmission line; and,
   a contact conductive layer being further overlaid on each conductive layer and having an outer contact surface, each signal transmission line being spaced from the outer contact surface of a corresponding contact conductive layer by a combined thickness of the substrate, a respective conductive layer, and the corresponding contact conductive layer.

2. The contact-type film probe as claimed in claim 1, wherein the substrate is made of any of polyimide, PET, PC, PMMA and polysulfone.

3. The contact-type film probe as claimed in claim 1, wherein the conductive layer is made of any of gold, silver, copper, nickel, chromium and aluminum.

4. The contact-type film probe as claimed in claim 1, wherein the contact conductive layer is made of any of gold, silver, copper, nickel, chromium and aluminum.

5. The contact-type film probe as claimed in claim 1, wherein the conductive layer has a thickness within 0.1 µm~several hundred µm.

6. The contact-type film probe as claimed in claim 1, wherein the contact conductive layer has a thickness within 0.1 µm~several hundred µm.

* * * * *